(12) United States Patent
Liu et al.

(10) Patent No.: US 11,876,100 B2
(45) Date of Patent: Jan. 16, 2024

(54) ARRAY SUBSTRATE AND METHOD OF MANUFACTURING THE SAME, PIXEL DRIVING METHOD, AND DISPLAY PANEL

(71) Applicant: BOE TECHNOLOGY GROUP CO., LTD., Beijing (CN)

(72) Inventors: Dongni Liu, Beijing (CN); Minghua Xuan, Beijing (CN); Feng Qu, Beijing (CN); Qi Qi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 811 days.

(21) Appl. No.: 16/976,530

(22) PCT Filed: Nov. 29, 2019

(86) PCT No.: PCT/CN2019/122203
§ 371 (c)(1),
(2) Date: Aug. 28, 2020

(87) PCT Pub. No.: WO2021/103012
PCT Pub. Date: Jun. 3, 2021

(65) Prior Publication Data
US 2021/0167094 A1 Jun. 3, 2021

(51) Int. Cl.
*H01L 27/12* (2006.01)
*G11C 19/28* (2006.01)

(52) U.S. Cl.
CPC ............ *H01L 27/124* (2013.01); *G11C 19/28* (2013.01)

(58) Field of Classification Search
None
See application file for complete search history.

(56) References Cited

U.S. PATENT DOCUMENTS

| 10,580,509 | B2* | 3/2020 | Li | G02F 1/13454 |
| 11,380,674 | B2* | 7/2022 | Chen | H01L 27/124 |
| 2005/0195141 | A1 | 9/2005 | Takeda | |
| 2012/0194773 | A1 | 8/2012 | Kim et al. | |
| 2017/0047030 | A1 | 2/2017 | Kim et al. | |

(Continued)

FOREIGN PATENT DOCUMENTS

| CN | 1664659 A | 9/2005 |
| CN | 104269428 A | 1/2015 |

(Continued)

*Primary Examiner* — Cassandra F Cox
(74) *Attorney, Agent, or Firm* — McDermott Will & Emery LLP

(57) ABSTRACT

An array substrate includes a base substrate including a first surface, a plurality of scanning signal lines disposed on the first surface, and at least two groups of shift register circuits disposed in a display area of the first surface. The first surface has the display area. Each scanning signal line extends along a first direction. Each group of shift register circuits includes a plurality of shift register circuits arranged along a second direction. Each shift register circuit is coupled to a scanning signal line. The first direction and the second direction intersect. At least one group of shift register circuits is disposed in a non-edge region of the display area. The shift register circuit disposed in the non-edge region of the display area is configured to transmit a scanning signal to the scanning signal line at both sides of the shift register circuit along the first direction.

18 Claims, 9 Drawing Sheets

(56) References Cited

U.S. PATENT DOCUMENTS

| | | |
|---|---|---|
| 2017/0117341 A1 | 4/2017 | Chen et al. |
| 2017/0148374 A1 | 5/2017 | Lee et al. |
| 2018/0293956 A1 | 10/2018 | Yao et al. |
| 2019/0155433 A1 | 5/2019 | Park et al. |
| 2020/0037433 A1 | 1/2020 | Dong |
| 2021/0217353 A1 | 7/2021 | Zhao et al. |

FOREIGN PATENT DOCUMENTS

| | | |
|---|---|---|
| CN | 104934005 A | 9/2015 |
| CN | 105139806 A | 12/2015 |
| CN | 106448466 A | 2/2017 |
| CN | 106448581 A | 2/2017 |
| CN | 107045850 A | 8/2017 |
| CN | 109658837 A | 4/2019 |
| CN | 109767735 A | 5/2019 |
| CN | 110007792 A | 7/2019 |
| CN | 110211525 A | 9/2019 |
| EP | 3 196 941 A1 | 7/2017 |

\* cited by examiner

ARRAY SUBSTRATE AND METHOD OF MANUFACTURING THE SAME, PIXEL DRIVING METHOD, AND DISPLAY PANEL

CROSS-REFERENCE TO RELATED APPLICATION

This application is a national phase entry under 35 USC 371 of International Patent Application No. PCT/CN2019/122203 filed on Nov. 29, 2019, which is incorporated herein by reference in its entirety.

TECHNICAL FIELD

The present disclosure relates to the field of display technologies, in particular to an array substrate and a method of manufacturing the same, a pixel driving method, and a display panel.

BACKGROUND

With the development of display technologies, people have increasingly higher demands on performances of a display screen in bezel width, display brightness, image quality, etc. For example, the display screen is required to have a narrow bezel and good display brightness uniformity.

SUMMARY

In one aspect, an array substrate is provided. The array substrate includes a base substrate, a plurality of scanning signal lines disposed on a first surface, and at least two groups of shift register circuits disposed in a display area of the first surface. The base substrate includes the first surface, and the first surface has the display area. Each of the plurality of scanning signal lines extends along the first direction. Each group of the at least two groups of shift register circuits includes a plurality of shift register circuits arranged along a second direction, and each of the plurality of shift register circuits is coupled to one scanning signal line. The first direction and the second direction intersect. At least one group of shift register circuits is disposed in a non-edge region of the display area. A shift register circuit disposed in the non-edge region of the display area is configured to transmit a scanning signal to the scanning signal line at both sides of the shift register circuit along the first direction.

In some embodiments, a distance between every two adjacent groups of shift register circuits is equal along the first direction.

In some embodiments, the at least two groups of shift register circuits are all disposed in the non-edge region of the display area.

In some embodiments, in a case where the distance between every two adjacent groups of shift register circuits is equal along the first direction, a distance between each of two outermost groups of shift register circuits and an edge of the display area closest thereto is half of the distance between every two adjacent groups of shift register circuits along the first direction.

In some embodiments, the number of groups of the shift register circuits is 3 to 5.

In some embodiments, the array substrate includes a plurality of sub-pixels arranged in a matrix. Each group of shift register circuits is disposed in a space between two adjacent columns of sub-pixels.

In some embodiments, the scanning signal line includes a gate scanning signal line, and the shift register circuit includes a gate shift register circuit; and the gate shift register circuit is coupled to the gate scanning signal line; and/or the scanning signal line includes a light-emitting scanning signal line, and the shift register circuit includes a light-emitting shift register circuit; and the light-emitting shift register circuit is coupled to the light-emitting scanning signal line. The gate shift register circuit is configured to transmit gate scanning signals to the gate scanning signal line. The light-emitting shift register circuit is configured to transmit light-emitting scanning signals to the light-emitting scanning signal line.

In some embodiments, the base substrate further includes a second surface opposite to the first surface. The array substrate further includes at least one fan-out structure disposed on the second surface. Each of the at least one fan-out structure includes a plurality of signal connection lines, and each of the plurality of signal connection lines extends from an edge of the second surface to a non-edge region of the second surface. The signal connection line is coupled to the shift register circuit.

In some embodiments, the array substrate further includes a plurality of control signal lines disposed on the first surface. The plurality of control signal lines extend along the second direction. Each shift register circuit in each group of shift register circuits is coupled to at least one of the plurality of control signal lines. One end of the signal connection line proximate to the edges of the second surface is coupled to one of the at least one control signal line. The control signal line is configured to transmit a control signal to the shift register circuit, so as to make the shift register circuit output a scanning signal under control of the control signals.

In some embodiments, the array substrate further includes at least one side structure disposed on a side face. The side face is located between the first surface and the second surface of the base substrate. The at least one side structure is in one-to-one correspondence with the at least one fan-out structure. Each of the at least one side structure includes a plurality of side connection lines, and one end of each of the plurality of side connection lines is coupled to the signal connection line, and another end thereof is coupled to the control signal line.

In some embodiments, a number of the fan-out structures and a number of the side structures both are 1 to 4.

In another aspect, a display panel is provided. The display panel includes the array substrate as described in any one of the foregoing embodiments, and a control chip coupled to the array substrate. The control signal line is configured to transmit control signals to the shift register circuits in the array substrate, so as to make the shift register circuits output scanning signals under control of the control signals.

In some embodiments, the control chip is disposed on a second surface of the base substrate of the array substrate; the second surface is opposite to the first surface of the base substrate. The control chip includes a control chip body and a plurality of first pads. The control chip body is configured to transmit the control signals to the plurality of first pads. In a case where the array substrate includes at least one fan-out structure, the plurality of first pads are bonded to a plurality of signal connection lines of the at least one fan-out structure.

In some embodiments, the display panel further includes a plurality of second pads disposed on a second surface of the base substrate of the array substrate; the second surface is opposite to the first surface of the base substrate. The plurality of second pads are coupled to the control chip. In a case where the array substrate includes at least one fan-out structure, the plurality of second pads are bonded to the plurality of signal connection lines of the at least one fan-out structure.

In yet another aspect, a pixel driving method is provided. The pixel driving method is applied to the display panel as described in any of the foregoing embodiments. The pixel driving method includes: the control chip of the display panel transmitting control signals to each group of the at least two groups of shift register circuits of the array substrate of the display panel; and each shift register circuit in each group of shift register circuits receiving the control signals, and transmitting scanning signals to the scanning signal line coupled to the shift register circuit along the first direction.

In yet another aspect, a method of manufacturing an array substrate is provided. The method includes; providing a base substrate including a first surface, and the first surface having a display area; forming a plurality of scanning signal lines on the first surface, and each scanning signal line of the plurality of scanning signal lines extending along a first direction; forming at least two groups of shift register circuits in the display area of the first surface, each group of the at least two groups of shift register circuits including a plurality of shift register circuits arranged along a second direction, and each shift register circuit of the plurality of shift register circuits being coupled to one scanning signal line of the scanning signal lines; wherein the first direction and the second direction intersect. At least one group of shift register circuits is disposed in a non-edge region of the display area. A shift register circuit disposed in the non-edge region of the display area is configured to transmit a scanning signal to the scanning signal line at both sides of the shift register circuit along the first direction.

In some embodiments, the base substrate further includes a second surface opposite to the first surface. The method further includes; forming at least one fan-out structure on the second surface. Each of the at least one fan-out structure includes a plurality of signal connection lines, and each of the plurality of signal connection lines extends from an edge of the second surface to a non-edge region of the second surface; the signal connection line is coupled to the shift register circuit.

In some embodiments, the method further includes: forming at least one side structure on a side face. The side face is located between the first surface and the second surface of the base substrate. The at least one side structure is in one-to-one correspondence with the at least one fan-out structure; each of the at least one side structure includes a plurality of side connection lines; and one end of each of the plurality of side connection lines is coupled to the signal connection line, and another end thereof is coupled to the shift register circuit.

BRIEF DESCRIPTION OF THE DRAWINGS

In order to describe technical solutions in the present disclosure more clearly, accompanying drawings to be used in some embodiments of the present disclosure will be introduced briefly. Obviously; the accompanying drawings to be described below are merely accompanying drawings of some embodiments of the present disclosure, and a person of ordinary skill in the art can obtain other drawings according to these drawings. In addition, accompanying drawings in the following description may be regarded as schematic diagrams, and are not limitations on an actual size of a product, an actual process of a method and an actual timing of signals that are involved in embodiments of the present disclosure.

DETAILED DESCRIPTION

The technical solutions in embodiments of the present disclosure will be described clearly and completely in combination with the accompanying drawings in some embodiments of the present disclosure. Obviously, the described embodiments are merely some but not all of the embodiments of the present disclosure. All other embodiments made on the basis of the embodiments of the present disclosure by a person of ordinary skill in the art shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the description, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials or characteristics may be included in any one or more embodiments or examples in any suitable manner.

Terms such as "first" and "second" are only used for descriptive purposes and are not to be construed as indicating or implying the relative importance or implicitly indicating the number of indicated technical features below. Thus, features defined by the terms "first" and "second" may explicitly or implicitly include one or more of the features.

In the description of the embodiments of the present disclosure, term "a/the plurality of" means two or more unless otherwise specified. Terms such as "upper", "lower", "left" and "right" are only used to indicate relative positional relationships. When an absolute position of the described object is changed, a relative positional relationship may also be accordingly changed.

Some embodiments may be described using the expression "coupled" and "connected" along with their derivatives. For example, term "connected" may be used in the description of some embodiments to indicate that two or more components are in direct physical or electrical contact with each other. For another example, term "coupled" may be used in the description of some embodiments to indicate that two or more components are in direct physical or electrical contact. The term "coupled" or "communicatively coupled", however, may also mean that two or more elements are not in direct contact with each other, but yet still cooperate or interact with each other. The embodiments disclosed herein are not necessarily limited in this context.

Figure 1:
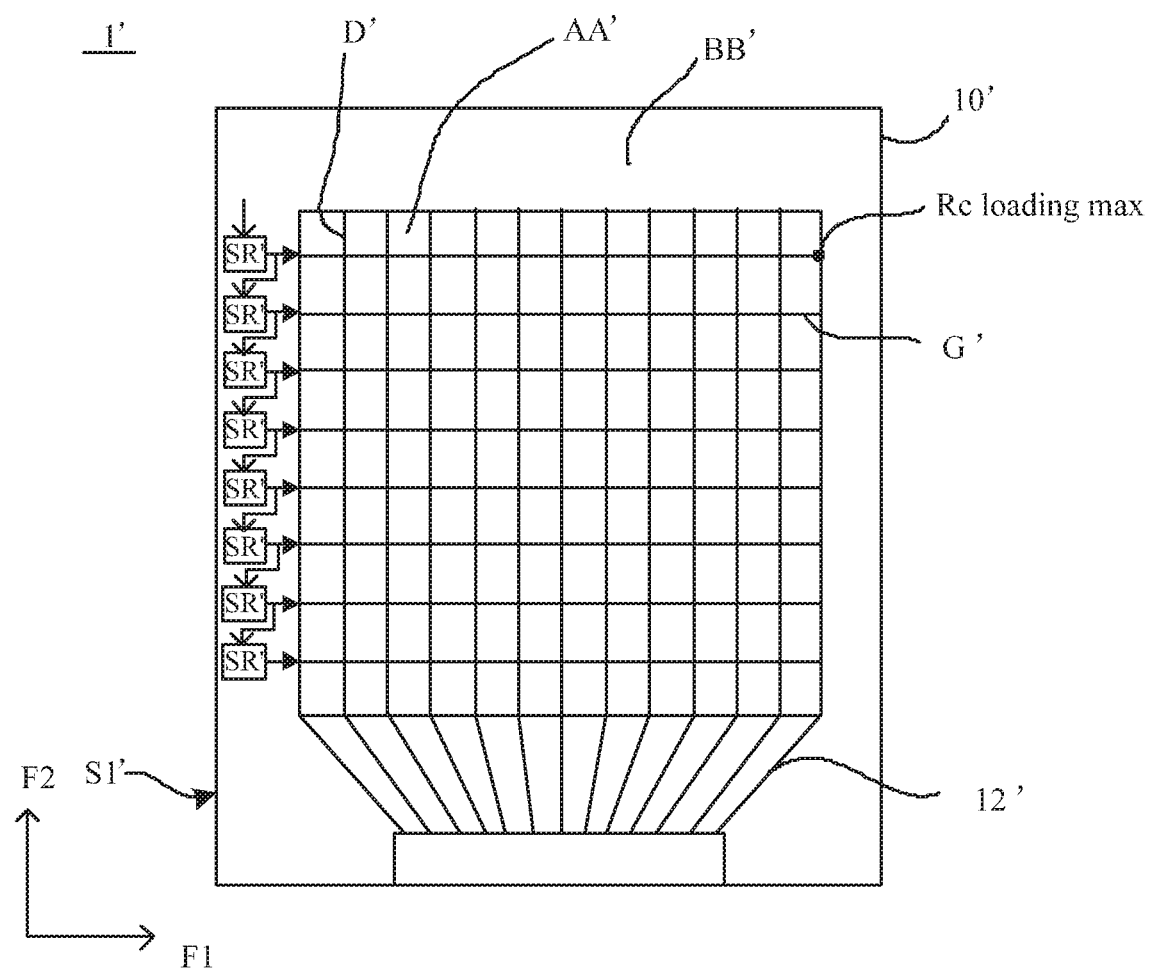
FIG. 1 is a top view of an array substrate in the related art.

In some related art, as shown in FIG. 1, an array substrate 1' includes a base substrate 10'. The base substrate 10' includes a first surface S1' having a display area AA' and a non-display area BB'. A plurality of scanning signal lines G' are disposed in the display area AA' and each of the plurality of scanning signal lines G' extends along a first direction. A group of shift register circuits are disposed in the non-display area BB' located at a left or right side of the array substrate 1' along the first direction (in FIG. 1, the left side is used for illustration). The group of shift register circuits includes a plurality of shift register circuits SR' arranged along a second direction, and each of the plurality of shift register circuits SR' is coupled to one scanning signal line G'. Each shift register circuit SR' is configured to transmit scanning signals to the scanning signal line G' at one side of the shift register circuit SR' along the first direction.

Herein, the first direction and the second direction intersect. For example, in a case where the array substrate includes a plurality of sub-pixels arranged in an array, the first direction F1 is a row direction in which a plurality of sub-pixels are arranged, and the second direction F2 is a column direction in which a plurality of sub-pixels are arranged. The first direction and the second direction are perpendicular to each other.

In a case where the shift register circuit SR' inputs scanning signals to the scanning signal line G', data signals on the data signal lines D' along the second direction are written into driving circuits of the sub-pixels in a corresponding row, and compensation for threshold voltages is performed.

For example, the array substrate is a passive light-emitting display (such as a LCD) or an active light-emitting display (such as OLED, or mini-LED), and the shift register circuit SR' includes a gate shift register circuit. In this case, the scanning signals transmitted by the shift register circuit SR' include gate scanning signals (Gate). The gate scanning signals (Gate) are used for progressive scanning of gate scanning signal lines, so as to turn on the sub-pixels in the corresponding row.

Or, in a case where the array substrate is an array substrate of an active light-emitting display (such as OLED, or mini-LED), the shift register circuit SR' includes a light-emitting shift register circuit. That is, the scanning signals transmitted by the shift register circuit SR' include light-emitting scanning signals (EM). The light-emitting scanning signals (EM) are used for progressive scanning of light-emitting scanning signal lines, so as to make the sub-pixels in the corresponding row emit light.

On this basis, due to the existence of resistance-capacitance loading (RC loading) in each scanning signal line G', the scanning signal at an ending of the scanning signal line G' (i.e., an end of the scanning signal line G' away from the shift register circuit) is weaker than the scanning signal at a beginning of the scanning signal line G' (i.e., an end of the scanning signal line G' proximate to the shift register circuit). Moreover, due to the existence of RC loading in the scanning signal line G', the scanning signal on the scanning signal line G' have a delay phenomenon. As a result, charging time of the sub-pixel(s) connected to the end of the scanning signal line G' in the array substrate 1' away from the shift register circuit SR' is insufficient, and the write time of the data signal (Date) and the compensation time of the threshold voltage (Vth) are insufficient, thereby resulting in uneven display.

For example, as shown in FIG. 1, with respect to each of the plurality of scanning signal lines G', the RC loading at the ending of the scanning signal line G' is the largest. The RC loading at the ending of the scanning signal line G' may be recorded as RC loading max, and a value of RC loading max is a'.

Figure 2:
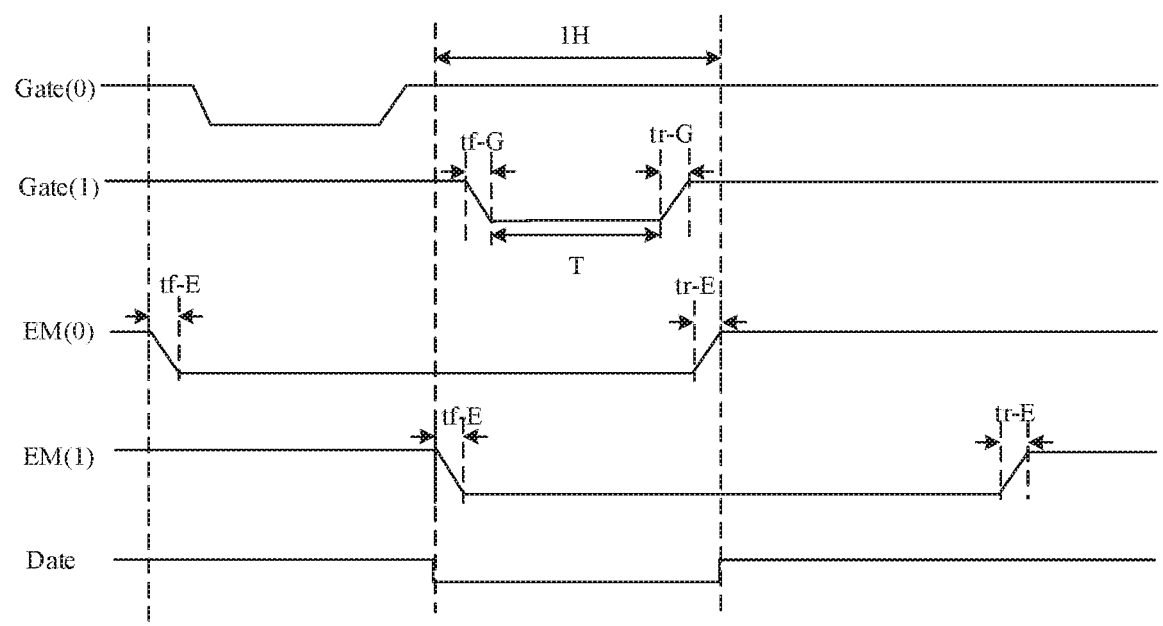
FIG. 2 is a timing diagram of scanning signals of a shift register circuit in the array substrate in the related art.

For example, as shown in FIGS. 1 and 2, FIG. 2 takes two gate scanning signals Gate (Gate(0) and Gate(1)) and two light-emitting scanning signals EM (EM(0) and EM(1)) as an example for illustration. A group of shift register circuits are disposed in the array substrate 1', and the RC loading max of each scanning signal line G' is a'. The RC loading of each scanning signal line is large. That is, the RC loading max of each scanning signal line G' is large. In this way, a rising time and a falling time of the scanning signal on the scanning signal line G' are increased. The rising time of the scanning signal includes a rising time of the gate scanning signal (tr-G) and a rising time of the light-emitting scanning signal (tr-E), and the falling time of the scanning signal includes a falling time of the gate scanning signal (tf-G) and a falling time of the light-emitting scanning signal (tf-E).

Herein, the gate scanning signal is configured to turn on a row of sub-pixels electrically connected to the scanning signal line G', so as to make the data signal lines D' write data signals (Date) into the corresponding sub-pixels. As shown in FIG. 2, 1H is the time for the data signals (Date) to be written in a row of sub-pixels, and the charge time T is equal to the time for the data signals (Date) to be written in a row of sub-pixels minus both the rising time of the scanning signal and the falling time of the scanning signal. That is, T=1 H (tr-G+tf-G) (tr-E+tf-E).

As a result, the rising time and the falling time of the scanning signal on the scanning signal line G' are increased, so that the writing time of the data signal (Date) and the compensation time of the threshold voltage (Vth) are reduced, thereby affecting uniformity of display.

Figure 3:
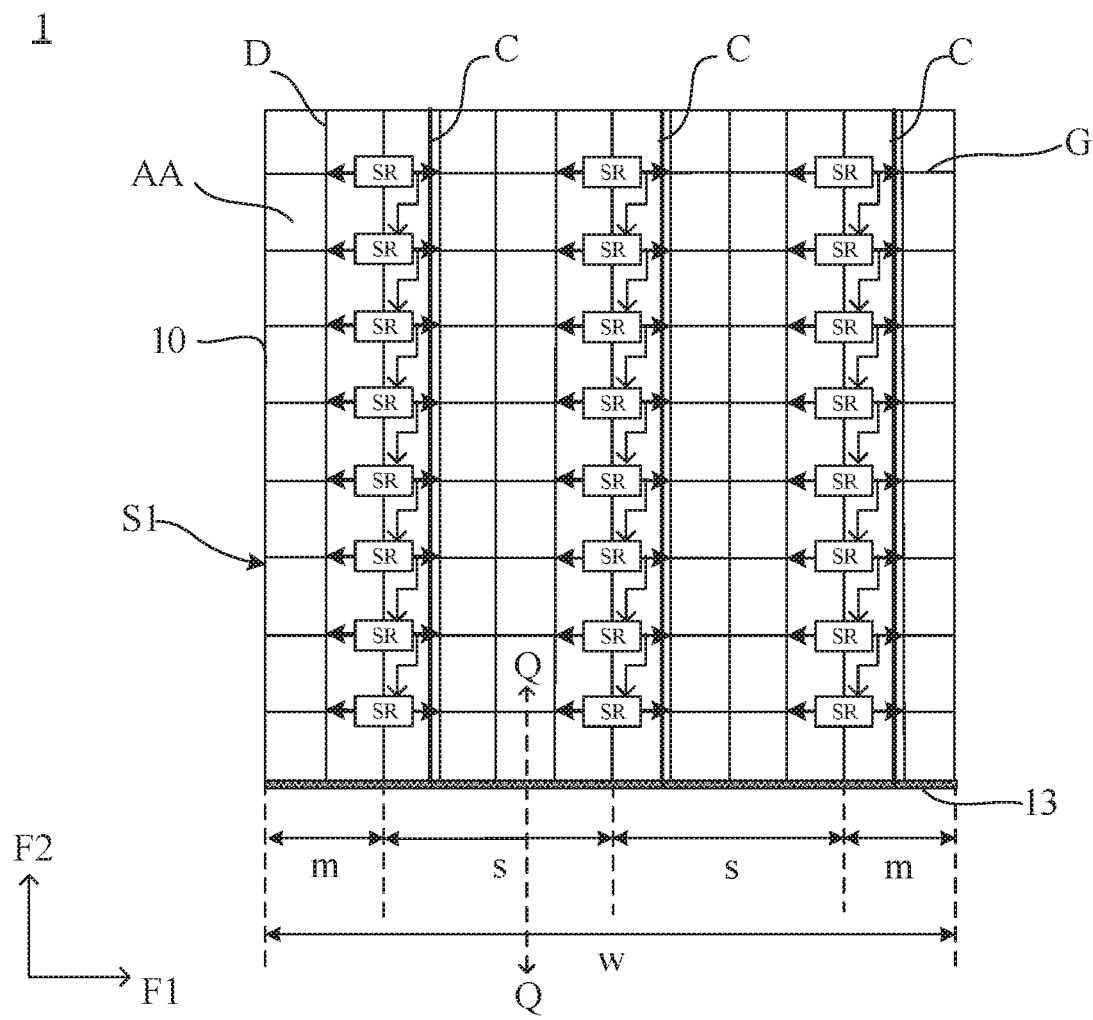
FIG. 3 is a top view of a first surface of an array substrate, according to some embodiments of the present disclosure.

On this basis, some embodiments of the present disclosure provide an array substrate 1. As shown in FIG. 3, the array substrate 1 includes: a base substrate 10, a plurality of scanning signal lines G disposed on a first surface S1, and at least two groups of shift register circuits disposed in a display area AA of the first surface S1. The base substrate 10 includes a first surface S1 having a display area AA. Each of the plurality of scanning signal lines G extends along a first direction. Each group of shift register circuits in the at least two groups of shift register circuits includes a plurality of shift register circuits SR arranged along a second direction, and each of the plurality of shift register circuits SR is coupled to one scanning signal line G. It will be noted that only three groups of shift register circuits are illustrated in FIG. 3. Some embodiments of the present disclosure do no limit the number of groups of shift register circuits, as long as the number of groups of shift register circuits is at least two.

In some examples, as shown in FIG. 3, the number of shift register circuits in each of the at least two groups of shift register circuits is the same. In addition, the number of shift register circuits SR coupled to each of the plurality of scanning signal lines G is the same as the number of groups of shift register circuits SR in the display area AA. Thus, a same scanning signal line G is coupled to at least two shift register circuits SR, and the at least two shift register circuits SR are from different groups in the at least two groups of shift register circuits.

In some examples, the first direction intersects with the second direction. As shown in FIG. 3, in a case where the array substrate includes a plurality of sub-pixels arranged in an array, the first direction F1 is a row direction or a horizontal direction in which a plurality of sub-pixels are arranged, and the second direction F2 is a column direction or a vertical direction in which a plurality of sub-pixels are arranged. The first direction and the second direction are perpendicular to each other.

In some embodiments, in the at least two groups of shift register circuits, at least one group of shift register circuits is disposed in a non-edge region of the display area AA. For example, there are two groups of shift register circuits in the display area AA of the array substrate 1; one group is disposed in the non-edge region of the display area AA, and the other group is disposed in an edge region of the display area AA. For another example, there are three groups of shift register circuits in the display area AA of the array substrate 1; one group is disposed in the non-edge region of the display area AA, and another two are disposed in the edge region of the display area AA; or, two groups are disposed in the non-edge region of the display area AA, and another group is disposed in the edge region of the display area AA. With respect to the at least two groups of shift register circuits, some embodiments of the present disclosure do no limit the number of groups of shift register circuits that are disposed in the non-edge region of the display area AA, as long as at least one group of shift register circuits is disposed in the non-edge region of display area AA. The shift register circuit SR disposed in the non-edge region of the display area AA is configured to transmit a scanning signal to the scanning signal line G at both sides of the shift register circuit along the first direction.

For example, the non-edge region of the display area AA is a region within the display area AA, and the non-edge region of the display area AA is opposite the edge region of the display area AA. The shift register circuit disposed in the edge region of the display area AA can only transmit the scanning signal to the scanning signal line G at one side of the shift register circuit along the first direction. The shift register circuit disposed in the non-edge region of the display area AA may transmit a scanning signal to the scanning signal line G at both sides of the shift register circuit along the first direction, or may optionally transmit a scanning signal to the scanning signal line G at one side of the shift register circuit along the first direction.

For example, the array substrate 1 may be applied to a liquid crystal display (LCD) panel, an organic light-emitting diode (O LED) display panel, a micro light-emitting diode (Micro-LED) display panel, a mini light-emitting diode (Mini-LED) display panel, or the like.

In some examples, the scanning signal line G includes a gate scanning signal line G1, and the shift register circuit SR includes a gate shift register circuit SR1. The gate shift register circuit SR1 is coupled to the gate scanning signal line G1, and the gate shift register circuit SR1 is configured to transmit the gate scanning signal (Gate) to the gate scanning signal line G1.

In some other examples, the scanning signal line G includes a light-emitting scanning signal line G2, and the shift register circuit SR includes a light-emitting shift register circuit SR2. The light-emitting shift register circuit SR2 is coupled to the light-emitting scanning signal line G2, and the light-emitting shift register circuit SR2 is configured to transmit the light-emitting scanning signal (EM) to the light-emitting scanning signal line G2.

In some other examples, the scanning signal line G includes a gate scanning signal line G1 and a light-emitting scanning signal line G2, and the shift register circuit includes a gate shift register circuit SR1 and a light-emitting shift register circuit SR2. The gate shift register circuit SR1 is coupled to the gate scanning signal line G1, and the light-emitting shift register circuit SR2 is coupled to the light-emitting scanning signal line G2, The gate shift register circuit SR1 is configured to transmit the gate scanning signal (Gate) to the gate scanning signal line G1, and the light-emitting shift register circuit SR2 is configured to transmit the light-emitting scanning signal (EM) to the light-emitting scanning signal line G2.

Figure 4:
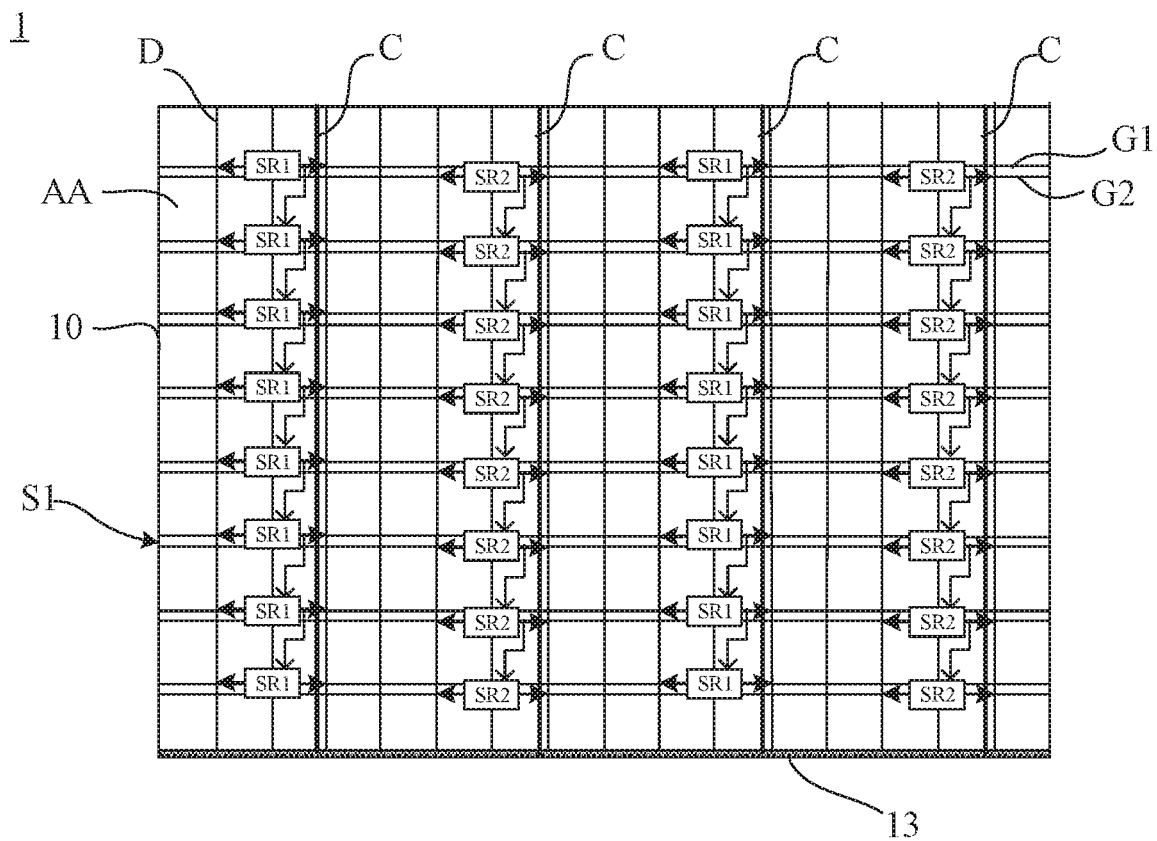
FIG. 4 is a top view of a first surface of another array substrate, according to some embodiments of the present disclosure.
Figure 5:
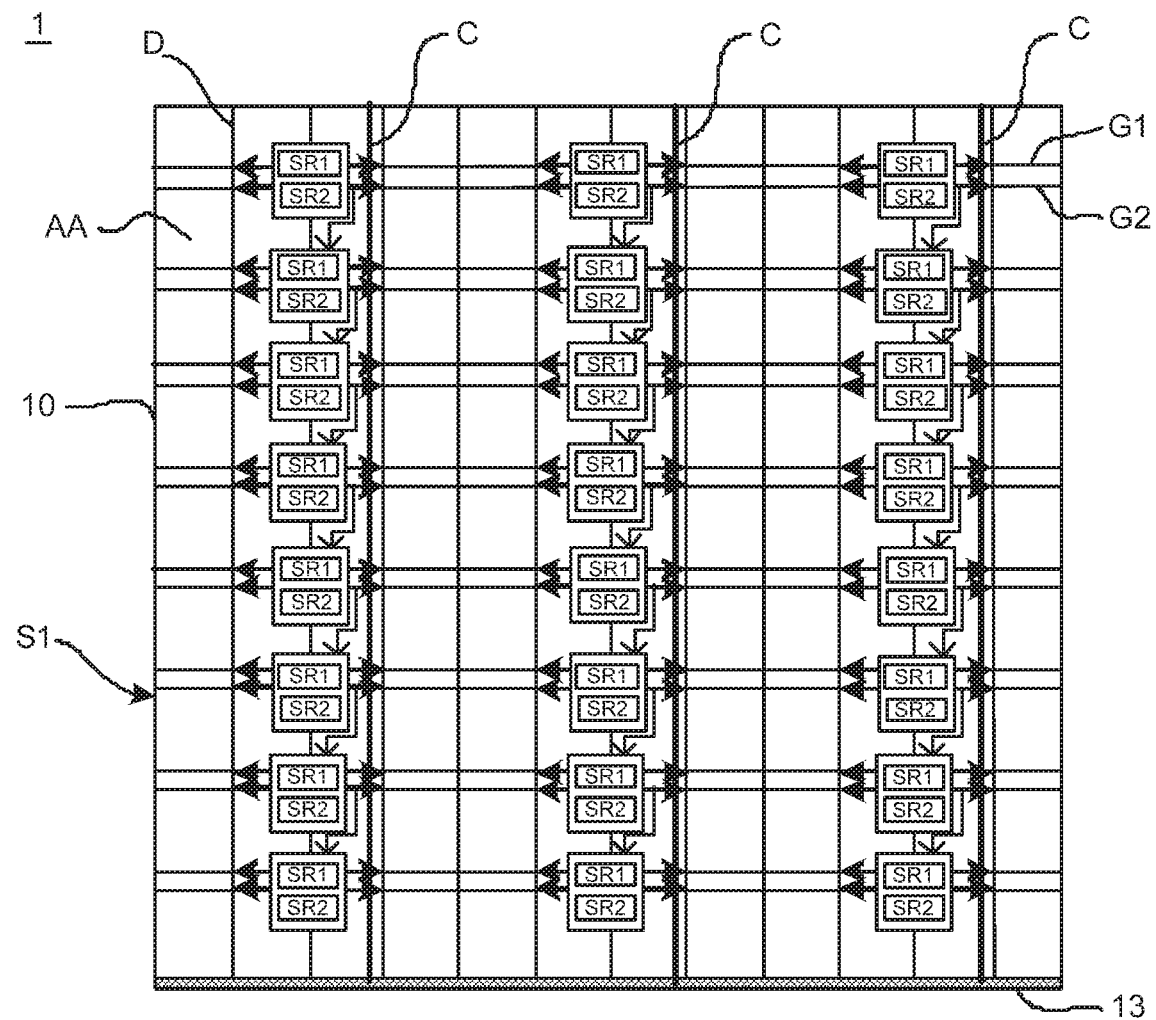
FIG. 5 is a top view of a first surface of yet another array substrate, according to some embodiments of the present disclosure.

For example, as shown in FIG. 4 (four groups of shift register circuits are used for illustration), the gate shift register circuit SR1 and the light-emitting shift register circuit SR2 are separately disposed and spaced apart from each other along the first direction. For another example, as shown in FIG. 5 (three groups of shift register circuits are used for illustration), the gate shift register circuit SR1 and the light-emitting shift register circuit SR2 are integrated into a same shift register circuit SR. That is, the shift register circuit is coupled to the gate scanning signal line G1 and the light-emitting scanning signal line G2, and the shift register circuit SR is configured to transmit the gate scanning signal (Gate) to the gate scanning signal line G1 and to transmit the light-emitting scanning signal (EM) to the light-emitting scanning signal line G2.

In some examples, as shown in FIG. 3, a distance s between every two adjacent groups of shift register circuits along the first direction is equal. In this way, the distribution of RC loading in each scanning signal line G may be more uniform.

In some other examples, a distance between every two adjacent groups of shift register circuits along the first direction may not be equal. Some embodiments of the present disclosure do no limit whether the distance between every two adjacent groups of shift register circuits is equal or not, as long as at least two groups of shift register circuits are provided in the display area AA.

In some embodiments, as shown in FIG. 3, at least two groups of shift register circuits are disposed at non-edge positions of the display area AA. For example, the at least two groups of shift register circuits are all disposed at the non-edge positions of the display area AA, and the distance between every two adjacent groups of shift register circuits is equal. For another example, the at least two groups of shift register circuits are all disposed at the non-edge positions of the display area AA, and the distance between every two adjacent groups of shift register circuits is not equal.

In some embodiments, in a case where the distance between every two adjacent groups of shift register circuits is equal, along the first direction, the distance m between each of two outermost groups of shift register circuits and an edge of the display area AA closest thereto is half of the distance s between every two adjacent groups of shift register circuits.

In some examples, a width of the display area of the array substrate 1 along the first direction is w, n groups of shift register circuits are disposed in the array substrate 1, and n is greater than or equal to two. Therefore, along the first direction, the distance between each of the two outermost groups of shift register circuits and the edge of the display area AA closest thereto is m, and $$m = \frac{w}{2n}.$$

Moreover, the distance between every two adjacent groups of shift register circuits is s, and s=2m.

On this basis, a value of RC loading max of each of the plurality of scanning signal lines G is a. In a case where conditions, such as the size and resolution, of the array substrate 1 are the same as those of the array substrate 1', $$a = \frac{a'}{2n}.$$

In this way, the RC loading max of each scanning signal line G is effectively reduced. That is, the RC loading in each scanning signal line G is effectively reduced. Moreover, the rising time of the scanning signal (tr-G and tr-E) and the falling time of the scanning signal (tf-G and tf-E) are reduced, which may avoid reducing the write time of the data signal (Date) and the compensation time of the threshold voltage (Vth), thereby ensuring the uniformity of the display brightness.

As shown in FIG. 2, the rising time of the scanning signal includes a rising time of the gate scanning signal (tr-G) and a rising time of the light-emitting scanning signal (tr-E), and the falling time of the scanning signal includes a falling time of the gate scanning signal (tf-G) and a falling time of the light-emitting scanning signal (tf-E).

As shown in FIG. 3, that the number of groups of the shift register circuits is three is taken as an example for illustration. A width of the array substrate 1 along the first direction is w. Therefore, along the first direction, the distance between each of the two outermost groups of shift register circuits and the edge of the display area AA closest thereto is m, and $$m = \frac{w}{2n},$$

where n is equal to three. The distance m between each of the two outermost groups of shift register circuits and the edge of the display area AA closest thereto is equal to $$\frac{w}{6}.$$

In the three groups of shift register circuits, the distance between every two adjacent groups of shift register circuits is s, and s=2m, where $$m = \frac{w}{6}.$$

Therefore, the distance s between every two adjacent groups of shift register circuits is equal to $$\frac{w}{3}.$$

On this basis, the value of RC loading max of each of the plurality of scanning signal lines is a, and $$a = \frac{a'}{2n},$$

where n=3, It can be seen that the value a of RC loading max of each scanning signal line is equal to $$\frac{a'}{6}.$$

It can be seen that the value of RC loading max of the scanning signal line in the array substrate 1 is one sixth of the value of RC loading max of the scanning signal line in the array substrate 1'. In this way, the RC loading in each scanning signal line G is effectively reduced, and the rising time of the scanning signal (tr-G and tr-E) and the falling time of the scanning signal (tf-G and tf-E) are reduced, which may avoid reducing the write time of the data signal (Date) and the compensation time of the threshold voltage (Vth), thereby ensuring the uniformity of the display brightness.

In some embodiments, the number of groups of shift register circuits SR disposed in the array substrate 1 is related to the size and the display resolution of the array substrate 1. For example, the larger the size of the array substrate or the higher the display resolution, the greater the number of groups of shift register circuits, thereby ensuring a small RC loading in each scanning signal line G, and ensuring the uniformity of the display brightness.

For example, in a case where the size of the array substrate 1 is 10.1 inches to 12.1 inches (such as 11 inches or 12 inches) or the display resolution is 480*270, the number of groups of shift register circuits may be set to 3 to 5.

In addition, in some examples, the pixel current in a LCD or an OLED display panel is dozens of nA, while the pixel current in a Micro-LED display panel or a Mini-LED display panel is dozens of µA, The pixel current required by the Micro-LED display panel or the Mini-LED display panel is about 1000 times the pixel current required by the LCD or OLED display panel.

In this case, in order to ensure the driving capability of the pixel current in the Micro-LED display panel or the Mini-LED display panel, it is necessary to increase a width-to-length ratio (\NIL) of the thin film transistor (TFT) in the pixel current path of the Micro-LED display panel or the Mini-LED display panel. However, the increase of the width-to-length ratio (W/L) of the thin film transistor leads to an increase of RC loading in each scanning signal line G in the array substrate. In this way, the rising time of the scanning signal (tr-G and tr-E) and the falling time of the scanning signal (tf-G and tf-E) will also be increased. As a result, the writing time of the data signal (Date) and the compensation time of the threshold voltage (Vth) are reduced, thereby affecting the uniformity of display brightness.

In the array substrate 1 in some embodiments described above, the RC loading in each scanning signal line G is effectively reduced. Therefore, it is possible to avoid an increase of RC loading caused by the increase of the width-to-length ratio (W/L) of the thin film transistor, and to avoid the increase of the rising time of the scanning signal (tr-G and tr-E) and the increase of the falling time of the scanning signal (tf-G and tf-E), and thus it is possible to avoid reducing the write time of the data signal (Date) and the compensation time of the threshold voltage (Vth). In this way, it is possible to better ensure the uniformity of display brightness of the Micro-LED display panel or the Mini-LED display panel.

In some embodiments, the array substrate 1 includes a plurality of sub-pixels arranged in a matrix, and each group of shift register circuits is disposed in a space between two adjacent columns of sub-pixels. In this way, the shift register circuits SR do not occupy a region other than the display area AA, thereby facilitating the array substrate 1 to achieve a narrow bezel display or a bezel-free display.

Figure 6:
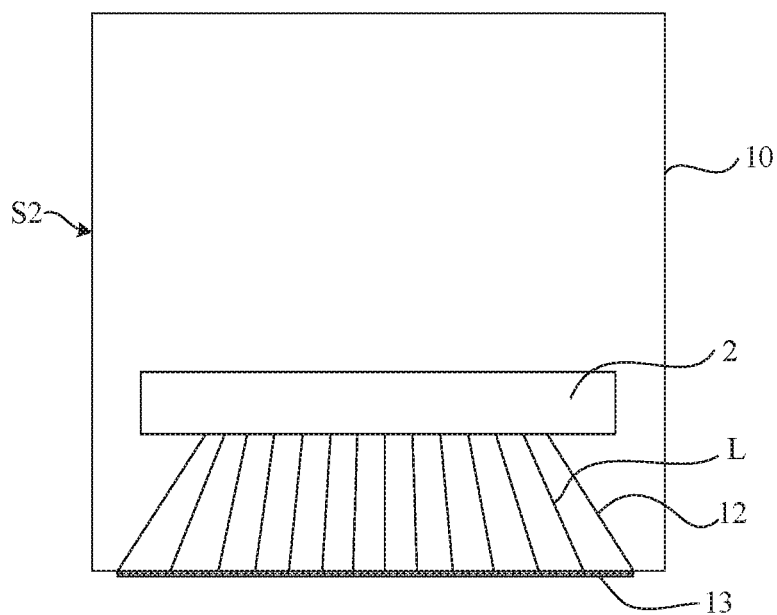
FIG. 6 is a top view of a second surface of an array substrate, according to some embodiments of the present disclosure.

In some embodiments, as shown in FIGS. 3 and 6, the base substrate 10 further includes a second surface S2 opposite to the first surface S1. The array substrate 1 further includes at least one fan-out structure 12 disposed on the second surface S2. Each of the at least one fan-out structure 12 includes a plurality of signal connection lines L, and each of the plurality of signal connection lines L extends from an edge of the second surface S2 to a non-edge region of the second surface S2. The signal connection line L is coupled to the shift register circuit SR.

Figure 7:
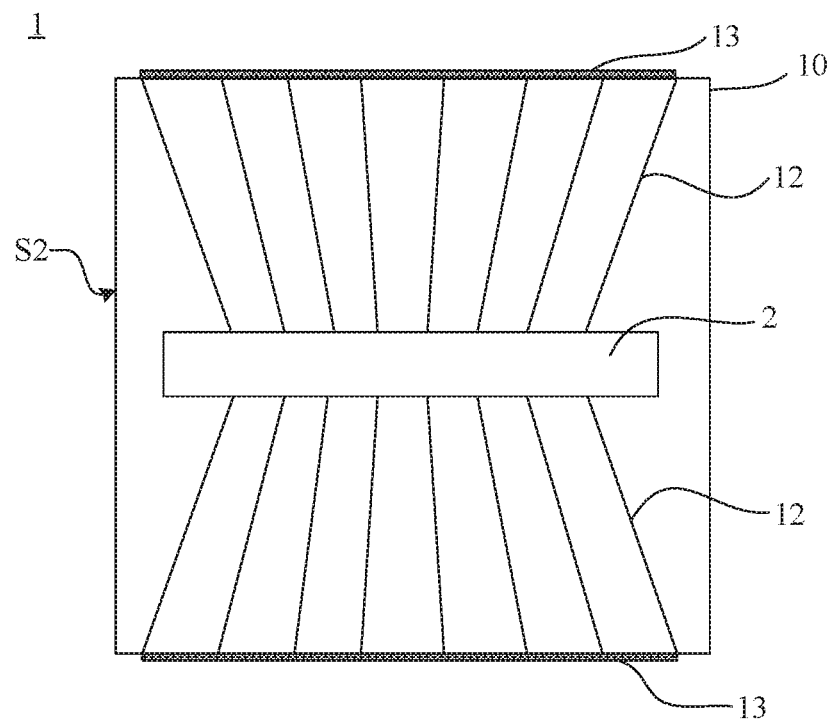
FIG. 7 is a top view of a second surface of another array substrate, according to some embodiments of the present disclosure.

In some examples, the number of fan-out structures 12 is 1 to 4. For example, as shown in FIG. 6, the number of fan-out structures 12 is one. For another example, as shown in FIG. 7, the number of fan-out structures 12 is two. For yet another example, the number of fan-out structures 12 may be three or four. In the case where the number of fan-out structures is one, a length of the signal connection line L on the second surface S2 may be effectively reduced, thereby reducing the complexity of arranging of wires and simplifying the manufacturing process.

In addition, for example, as shown in FIG. 1, a group of shift register circuits and a fan-out structure 12' are all located in the non-display area BB' of the first surface S1' of the array substrate Each shift register circuit occupies a certain volume and area of the array substrate 1' due to its circuit structure. The shift register circuit SR' and the fan-out structure 12' occupy a large area of the first surface S1', so that a display panel with the array substrates 1' can not meet the requirement of narrow bezel or bezel-less.

In some embodiments of the present disclosure, the shift register circuit SR is disposed in the display area AA of the first surface S1 of the array substrate 1, and the fan-out structure 12 is disposed on the second surface S2 of the array substrate 1. In this way, it is advantageous for the array substrate 1 to realize the narrow bezel display or the bezel-free display.

In some embodiments, as shown in FIG. 3, the array substrate 1 further includes: a plurality of control signal lines C that are disposed on the first surface S1 and extends along the second direction. Each shift register circuit SR in each group of shift register circuits is coupled to at least one of the plurality of control signal lines C. It will be noted that only three control signal lines C are used for illustration in FIG. 3.

Moreover, one end of the signal connection line L proximate to the edge of the second surface S2 is coupled to one of the at least one control signal line C. The control signal line C is configured to transmit control signals to the shift register circuit SR, so as to make the shift register circuit SR output scanning signals under control of the control signals.

For example, the control signal includes at least one of a clock signal, a constant voltage signal (such as high level VGH or low level VGL), or a turn-on signal (such as a STV signal). There are one or more groups of the clock signals, and each group of clock signals includes a CLK signal and a CLKB signal that are complementary. Each group of clock signals corresponds to a group of shift register circuits.

In some embodiments, as shown in FIGS. 3 and 6, the array substrate 1 further includes at least one side structure 13 disposed on a side face of the base substrate 10. The side face is between the first surface S1 and the second surface S2. The at least one side structure 13 is in one-to-one correspondence with the at least one fan-out structure 12. Each of the at least one side structure includes a plurality of side connection lines, one end of each of the plurality of side connection lines is coupled to the signal connection line L, and another end thereof is coupled to the control signal line C. Therefore, the coupling between the signal connection line L and the shift register circuit SR is realized through the side connection line.

In some embodiments, the number of the side structures is 1 to 4. As shown in FIGS. 6 and 7, the number of the side structures 13 is the same as the number of the fan-out structures 12, and the side structure 13 is in one-to-one correspondence with the fan-out structure 12.

For example, a material of the side structure 13 is metal or silver conductive adhesive. The metal includes at least one of silver, copper, or the like, so that the side structure may have good conductivity.

Figure 8:
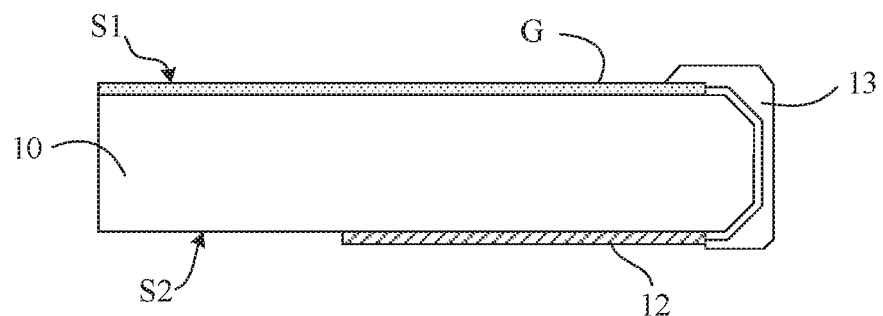
FIG. 8 is a partial cross-sectional view of the array substrate at a QQ position in FIG. 3.

In some examples, as shown in FIG. 8, in a vertical direction of the base substrate 10, an orthographic projection of the side structure 13 on the base substrate 10 is non-overlapping with an orthographic projection of the fan-out structure 12 on the base substrate 10.

Figure 9:
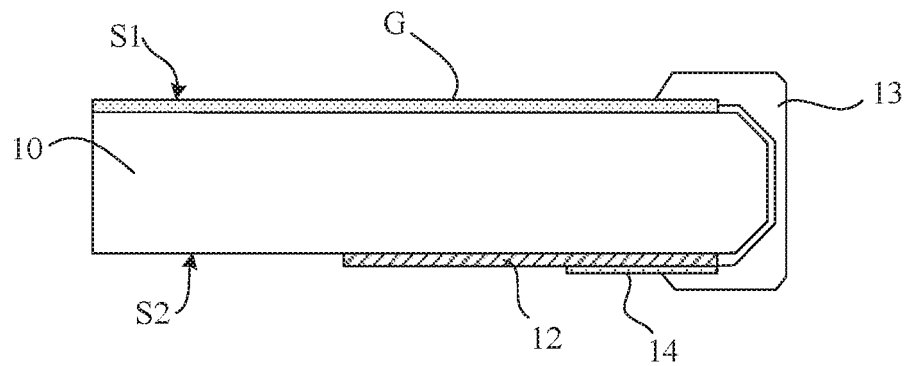
FIG. 9 is another partial cross-sectional view of the array substrate at the QQ position in FIG. 3.

In some other examples, as shown in FIG. 9, in the vertical direction of the base substrate 10, the orthographic projection of the side structure 13 on the base substrate 10 overlaps with the orthographic projection of the fan-out structure 12 on the base substrate 10.

In some embodiments, in the vertical direction of the base substrate 10, in a case where the orthographic projection of the side structure 13 on the base substrate 10 overlaps with the orthographic projection of the fan-out structure 12 on the base substrate 10, as shown in FIG. 9, the array substrate 1 further includes a conductive layer 14 disposed between the fan-out structure 12 and the side structure 13. The orthographic projection of the conductive layer 14 on the base substrate 10 is within a range of the orthographic projection of the fan-out structure 12 on the base substrate 10. The conductive layer 14 ensures an effective connection between the fan-out structure 12 and the side structure 13.

For example, the material of the conductive layer 14 is metal or indium tin oxide (ITO) with good conductivity.

Figure 10A:
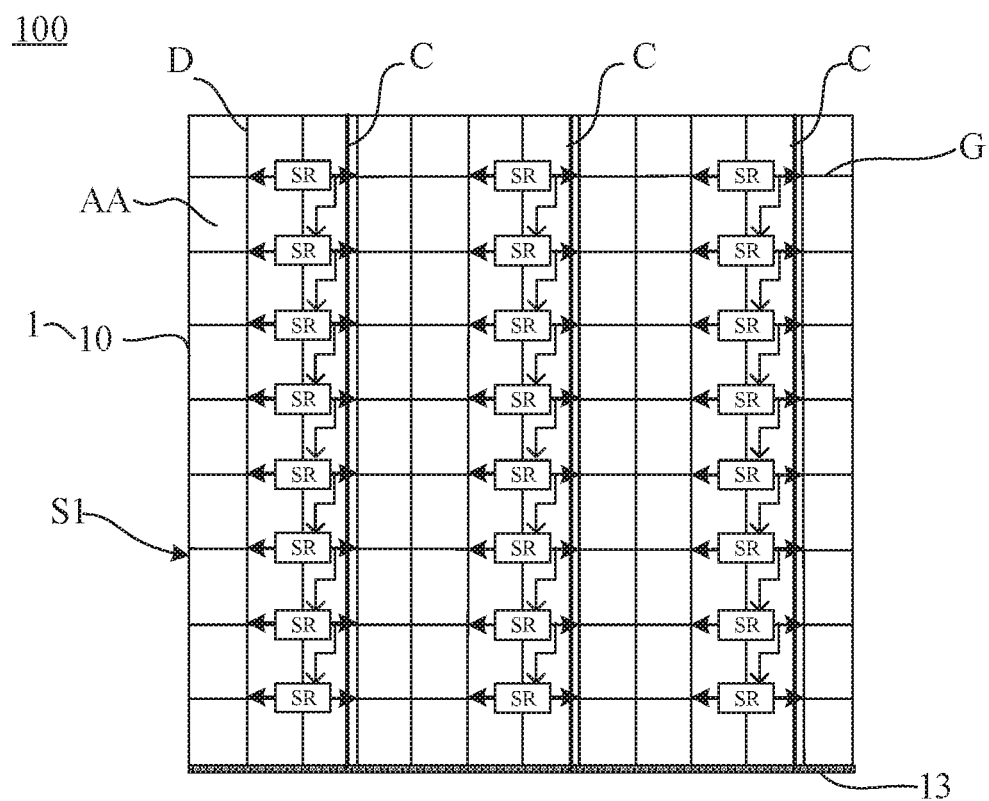
FIG. 10a is a top view of a first surface of a display panel, according to some embodiments of the present disclosure.
Figure 10B:
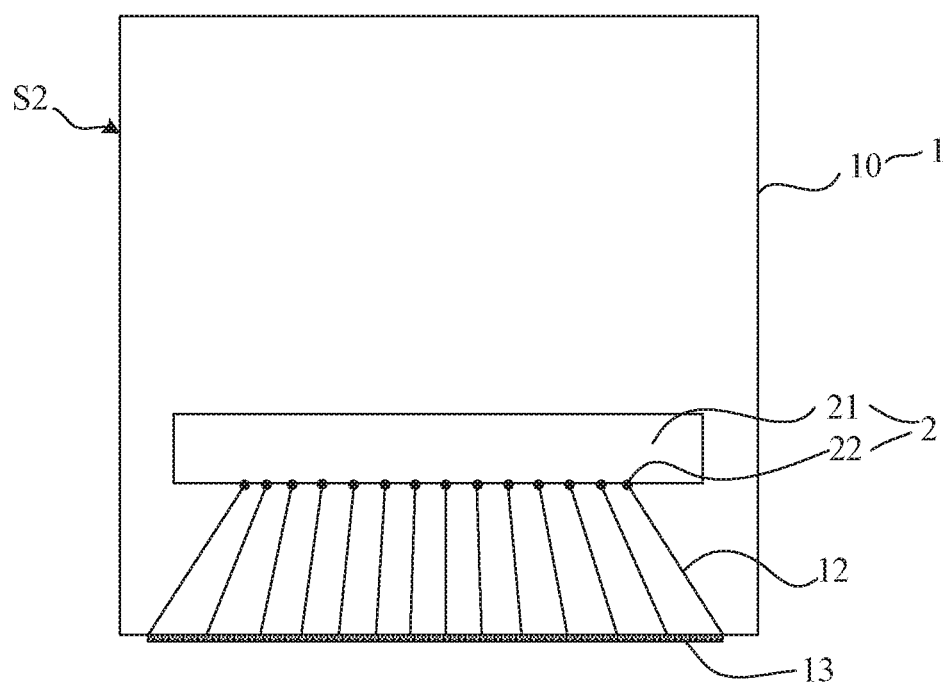
FIG. 10b is a top view of a second surface of a display panel, according to some embodiments of the present disclosure.

Some embodiments of the present disclosure further provide a display panel 100. As shown in FIGS. 10a and 10b, the display panel 100 includes: an array substrate 1 as disclosed in some embodiments described above, and a control chip coupled to the array substrate 1. The control chip is configured to transmit control signals to shift register circuits of the array substrate 1, so as to make the shift register circuits output scanning signals under control of the control signals.

For example, the control chip is directly disposed on the array substrate 1: or, the control chip is not directly disposed on the array substrate 1, but is coupled to the array substrate 1 through electronic connectors (such as pads, or connection lines). Some embodiments of the present disclosure do not limit this, as long as the control chip may transmit the control signals to the shift register circuits of the array substrate 1 and the shift register circuits may output scanning signals under the control of the control signals.

In some embodiments, as shown in FIG. 10b, a control chip 2 is directly disposed on the array substrate 1. The base substrate 10 includes a second surface S2 opposite to the first surface S1, and the control chip 2 is disposed on the second surface S2 of the base substrate 10 in the array substrate 1. The control chip 2 includes a control chip body 21 and a plurality of first pads 22. The control chip body 21 is configured to transmit control signals to the plurality of first pads 22. Moreover, the plurality of first pads 22 are bonded to a plurality of signal connection lines L of at least one fan-out structure 12.

In this way, the control chip 2 is disposed on the second surface S2 of the base substrate 10, which may prevent the control chip from occupying the space of the first surface S1 of the base substrate 10. It is beneficial to make the display panel 100 realize the narrow bezel display or the bezel-free display.

For example, each of the plurality of first pads 22 may be bonded to one of the plurality of signal connection lines through an anisotropic conductive film (ACF). Some embodiments of the present disclosure do not limit the bonding manner of the first pads 22 and the signal connection lines.

Figure 11:
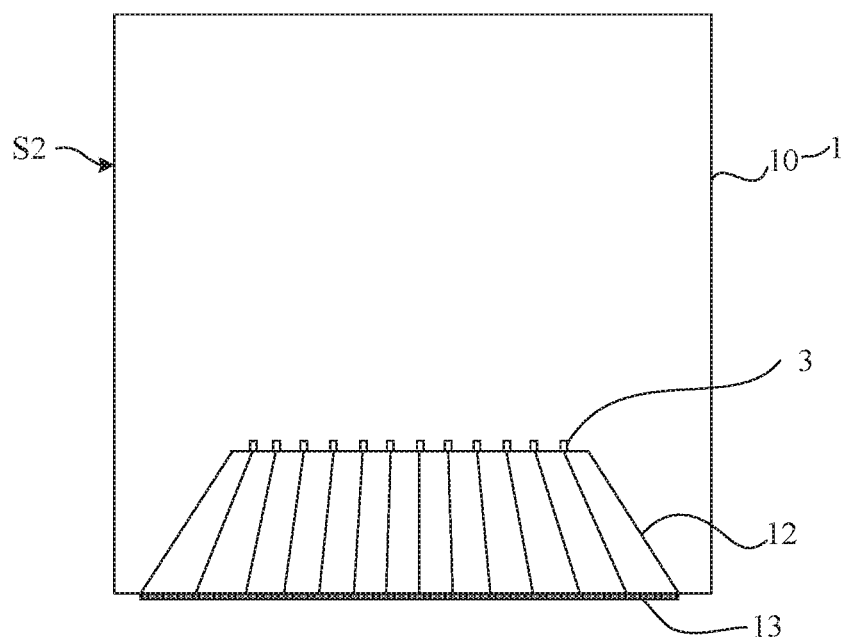
FIG. 11 is a top view of a second surface of another display panel, according to some embodiments of the present disclosure.

In some embodiments, the control chip is not directly disposed on the array substrate 1. As shown in FIG. 11, the base substrate 10 includes a second surface S2 opposite to the first surface S1, and the display panel 100 further includes a plurality of second pads 3 disposed on the second surface S2 of the base substrate 10 in the array substrate 1. The plurality of second pads 3 are coupled to the control chip. Moreover, the plurality of second pads 3 are bonded to a plurality of signal connection lines of at least one fan-out structure 12.

In this way, the control chip is not disposed on the first surface S1 of the base substrate 10, and the plurality of second pads 3 coupled to the control chip are disposed on the second surface S2 of the base substrate 10. The control chip 2 and the second pads 3 do not occupy the space of the first surface S1 of the base substrate 10; it is beneficial to make the display panel 100 achieve the narrow bezel display or the bezel-free display.

For example, each of the plurality of second pads 3 may be bonded to one of the plurality of signal connection lines through the anisotropic conductive film (ACF). Some embodiments of the present disclosure do not limit the bonding manner of the second pads 3 and the signal connection lines.

For example, the display panel 100 is a liquid crystal display (LCD) panel, an organic light-emitting diode (OLED) display panel, a micro light-emitting diode (Micro-LED) display panel or a mini light-emitting diode (Mini-LED) display panel.

Beneficial effects of the display panel in some embodiments of the present disclosure are the same as beneficial effects of the array substrate in some embodiments described above, which will not be described here again.

Some embodiments of the present disclosure provide a pixel driving method. The pixel driving method is applied to the display panel as described in any one of the foregoing embodiments, and the pixel driving method includes S11 and S12.

In S11, a control chip 2 of a display panel 100 sends control signals to each group of at least two groups of shift register circuits in an array substrate 1 of the display panel 100.

In S12, each shift register circuit in each group of shift register circuits receives the control signals, and transmits scanning signals to a scanning signal line coupled thereto along a first direction.

In this way, RC loading in each scanning signal line G is effectively reduced, and a rising time of the scanning signal (tr-G and tr-E) and a falling time of the scanning signal (tf-G and tf-E) are reduced, which may avoid reducing a write time of data signal (Date) and a compensation time of threshold voltage (Vth), thereby ensuring uniformity of display.

In some examples, in the at least two groups of shift register circuits, at least one group of shift register circuits is disposed in the non-edge region of the display area AA of the first surface S1 of the array substrate 1. That is, one or two groups of shift register circuits is disposed in the edge region of the display area AA. In this case, after receiving control signals transmitted by the control chip, according to the control signals, each shift register circuit in each group of shift register circuits disposed in the non-edge region transmits a scanning signal to the scanning signal line coupled to the shift register circuit at both sides thereof along the first direction, After receiving the control signals transmitted by the control chip, according to the control signals, each shift register circuit in each group of shift register circuits disposed in the edge region transmits a scanning signal to the scanning signal line coupled to the shift register circuit at one side thereof along the first direction.

In some other examples, at least two groups of shift register circuits are disposed in the non-edge region of the display area AA of the first surface S1 of the array substrate 1, In this case, after receiving the control signals transmitted by the control chip, according to the control signals, each shift register circuit in each group of the at least two groups of shift register circuits transmits a scanning signal to the scanning signal line coupled to the shift register circuit at both sides thereof along the first direction.

Some embodiments of the present disclosure provide a method of manufacturing an array substrate. The method includes the following steps.

A base substrate 10 is provided. The base substrate 10 includes a first surface S1 having a display area AA.

A plurality of scanning signal lines G are formed on the first surface S1, Each of the plurality of scanning signal lines G extends in a first direction.

At least two groups of shift register circuits are formed in the display area AA of the first surface S1. Each group of the at least two groups of shift register circuits includes a plurality of shift register circuits SR arranged along a second direction, and each of the plurality of shift register circuits SR is coupled to one of the scanning signal lines G. The first direction and the second direction intersect.

At least one group of shift register circuits is disposed in a non-edge region of the display area AA. The shift register circuit SR disposed in the non-edge region of the display area is configured to transmit the scanning signal to the scanning signal line G at both sides of the shift register circuit along the first direction.

It will be noted that the shift register circuit includes a plurality of thin film transistors formed by stacking a gate electrode layer, a gate insulating layer, an active layer, a source-drain electrode layer, etc. In some embodiments, the manufacturing of the scanning signal lines G may be compatible with a manufacturing process of one or some film layers of the thin film transistor. For example, in a case where the scanning signal line G is a gate scanning signal line G1, the gate scanning signal line G1 may be formed in a same layer with the gate of the thin film transistor.

In some embodiments, the base substrate 10 further includes a second surface S2 opposite to the first surface S1. The method further includes the following step.

At least one fan-out structure 12 is formed on the second surface S2. Each of the at least one fan-out structure 12 includes a plurality of signal connection lines L, and each of the plurality of signal connection lines L extends from an edge of the second surface S2 to a non-edge region of the second surface S2. The signal connection line L is coupled to the shift register circuit SR.

In some examples, during the process of manufacturing the array substrate disclosed in some embodiments described above, a plurality of scanning signal lines G and at least two groups of shift register circuits may be formed on the first surface S1 of the base substrate 10 first, and then at least one fan-out structure 12 is formed on the second surface S2 of the base substrate 10. Or, at least one fan-out structure 12 may be formed on the second surface S2 of the base substrate 10 first, and then a plurality of scanning signal lines G and at least two groups of shift register circuits are formed on the first surface S1 of the base substrate 10. That is, in some embodiments of the disclosure, the order of manufacturing structures on the first side S1 and structures on the second side S2 is not limited.

For example, if the structures on the first surface S1 are manufactured first and then the structures on the second surface S2 are manufactured, after the structures on the first surface S1 are manufactured, a protective film process is used to protect the structures that have been manufactured on the first surface S1, and then the structures on the second surface S2 are manufactured. Similarly, the manufacturing process in which the structures on the second surface S2 are manufactured first and then the structures on the first surface S1 are manufactured is the same, and details are not described herein again. Therefore, it may be ensured that the first surface S1 and the second surface S2 do not interfere with each other during the manufacturing process, so as to avoid damage to a previously manufactured surface when manufacturing a surface to be manufactured later.

In some embodiments, the method further includes: forming at least one side structure 13 on a side face. The side face is located between the first surface S1 and the second surface S2 of the base substrate. The at least one side structure 13 is in one-to-one correspondence with the at least one fan-out structure 12. Each of the at least one side structure 13 includes a plurality of side connection lines, and one end of each of the plurality of side connection lines is coupled to a signal connection line L, and another end thereof is coupled to the shift register circuit SR.

For example, a method of manufacturing the side structure includes one of 3D printing, photocopying, sputtering or etching.

Beneficial effects of the method of manufacturing the array substrate are the same as beneficial effects of the array substrate in some embodiments described above, which will not be described here again.

The foregoing descriptions are merely specific implementation manners of the present disclosure, but the protection scope of the present disclosure is not limited thereto. Changes or replacements that any person skilled in the art can conceive of within the technical scope of the present disclosure shall all be included in the protection scope of the present disclosure. Therefore, the protection scope of the present disclosure shall be subject to the protection scope of the claims.

What is claimed is:

1. An array substrate, comprising:
   a base substrate including a first surface, and the first surface having a display area;
   a plurality of scanning signal lines disposed on the first surface, and each scanning signal line of the plurality of scanning signal lines extending along a first direction; and
   at least two groups of shift register circuits disposed in the display area of the first surface;
   wherein each group of the at least two groups of shift register circuits includes a plurality of shift register circuits arranged along a second direction, and each shift register circuit of the plurality of shift register circuits is coupled to one scanning signal line;
   wherein the first direction and the second direction intersect;
   wherein at least one group of shift register circuits is disposed in a non-edge region of the display area; and a shift register circuit disposed in the non-edge region of the display area is configured to transmit a scanning signal to the scanning signal line at both sides of the shift register circuit along the first direction.

2. The array substrate according to claim 1, wherein a distance between every two adjacent groups of shift register circuits is equal along the first direction.

3. The array substrate according to claim 1, wherein the at least two groups of shift register circuits are all disposed in the non-edge region of the display area.

4. The array substrate according to claim 3, wherein in a case where the distance between every two adjacent groups of shift register circuits is equal along the first direction,
   along the first direction, a distance between each of two outermost groups of shift register circuits and an edge of the display area closest thereto is half of the distance between every two adjacent groups of shift register circuits.

5. The array substrate according to claim 1, wherein a number of groups of the shift register circuits is 3 to 5.

6. The array substrate according to claim 1, comprising a plurality of sub-pixels arranged in a matrix, and each group of shift register circuits being disposed in a space between two adjacent columns of sub-pixels.

7. The array substrate according to claim 1, wherein
   the scanning signal line includes a gate scanning signal line, and the shift register circuit includes a gate shift register circuit; and the gate shift register circuit is coupled to the gate scanning signal line; and/or
   the scanning signal line includes a light-emitting scanning signal line, and the shift register circuit includes a light-emitting shift register circuit; and the light-emitting shift register circuit is coupled to the light-emitting scanning signal line;

wherein the gate shift register circuit is configured to transmit gate scanning signals to the gate scanning signal line; the light-emitting shift register circuit is configured to transmit light-emitting scanning signals to the light-emitting scanning signal line.

8. The array substrate according to claim 1, wherein the base substrate further includes a second surface opposite to the first surface;
the array substrate further comprises at least one fan-out structure disposed on the second surface, wherein each fan-out structure of the at least one fan-out structure includes a plurality of signal connection lines, and each signal connection line of the plurality of signal connection lines extends from an edge of the second surface to a non-edge region of the second surface; and
the signal connection line is coupled to the shift register circuit.

9. The array substrate according to claim 8, further comprising: a plurality of control signal lines disposed on the first surface, and the plurality of control signal lines extending along the second direction, wherein
each shift register circuit in each group of shift register circuits is coupled to at least one control signal line of the plurality of control signal lines;
one end of the signal connection line proximate to the edge of the second surface is coupled to one control signal line of the at least one control signal line; and
the control signal line is configured to transmit a control signal to the shift register circuit, so as to make the shift register circuit output a scanning signal under control of the control signal.

10. The array substrate according to claim 9, further comprising:
at least one side structure disposed on a side face, the side face being located between the first surface and the second surface of the base substrate, wherein
the at least one side structure is in one-to-one correspondence with the at least one fan-out structure; and
each of the at least one side structure includes a plurality of side connection lines, one end of each of the plurality of side connection lines is coupled to the signal connection line, and another end thereof is coupled to the control signal line.

11. The array substrate according to claim 10, wherein a number of the fan-out structures and a number of the side structures both are 1 to 4.

12. A display panel, comprising:
the array substrate according to claim 1; and
a control chip coupled to the array substrate, wherein the control chip is configured to transmit control signals to the shift register circuits in the array substrate, so as to make the shift register circuits output scanning signals under control of the control signals.

13. The display panel according to claim 12, wherein the control chip is disposed on a second surface of the base substrate of the array substrate; the second surface is opposite to the first surface of the base substrate;
the control chip includes a control chip body and a plurality of first pads;
the control chip body is configured to transmit the control signals to the plurality of first pads; and
in a case where the array substrate includes at least one fan-out structure, the plurality of first pads are bonded to a plurality of signal connection lines of the at least one fan-out structure.

14. The display panel according to claim 12, further comprising a plurality of second pads disposed on a second surface of the base substrate of the array substrate; the second surface being opposite to the first surface of the base substrate; wherein
the plurality of second pads is coupled to the control chip; and
in a case where the array substrate includes at least one fan-out structure, the plurality of second pads are bonded to a plurality of signal connection lines of the at least one fan-out structure.

15. A pixel driving method for the display panel according to claim 12, the pixel driving method comprising:
the control chip of the display panel transmitting control signals to each group of the at least two groups of shift register circuits in the array substrate of the display panel; and
each shift register circuit in each group of shift register circuits receiving the control signals, and transmitting scanning signals to the scanning signal line coupled to the shift register circuit along the first direction.

16. A method of manufacturing an array substrate, comprising:
providing a base substrate including a first surface, and the first surface having a display area;
forming a plurality of scanning signal lines on the first surface, and each scanning signal line of the plurality of scanning signal lines extending along a first direction;
forming at least two groups of shift register circuits in the display area of the first surface;
wherein each group of the at least two groups of shift register circuits includes a plurality of shift register circuits arranged along a second direction, and each shift register circuit of the plurality of shift register circuits is coupled to one scanning signal line of the scanning signal lines;
wherein the first direction and the second direction intersect;
wherein at least one group of shift register circuits is disposed in a non-edge region of the display area; a shift register circuit disposed in the non-edge region of the display area is configured to transmit a scanning signal to the scanning signal line at both sides of the shift register circuit along the first direction.

17. The method according to claim 16, wherein the base substrate further includes a second surface opposite to the first surface;
the method further comprises:
forming at least one fan-out structure on the second surface, wherein
each fan-out structure of the at least one fan-out structure includes a plurality of signal connection lines, each signal connection line of the plurality of signal connection lines extends from an edge of the second surface to a non-edge region of the second surface; and
the signal connection line is coupled to the shift register circuit.

18. The method according to claim 17, further comprising:
forming at least one side structure on a side face, the side face being located between the first surface and the second surface of the base substrate; wherein
the at least one side structure is in one-to-one correspondence with the at least one fan-out structure; each of the at least one side structure includes a plurality of side connection lines; and one end of each of the plurality of side connection lines is coupled to the signal connection line, and another end thereof is coupled to the shift register circuit.

* * * * *